United States Patent
Horvath

(10) Patent No.: US 9,599,643 B2
(45) Date of Patent: Mar. 21, 2017

(54) PEAK DETECTOR

(75) Inventor: András Vince Horvath, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 1574 days.

(21) Appl. No.: 13/248,609

(22) Filed: Sep. 29, 2011

(65) Prior Publication Data
US 2013/0082682 A1    Apr. 4, 2013

(51) Int. Cl.
*G01R 19/165* (2006.01)
*G01R 19/04* (2006.01)

(52) U.S. Cl.
CPC ........ *G01R 19/16528* (2013.01); *G01R 19/04* (2013.01)

(58) Field of Classification Search
None
See application file for complete search history.

(56) References Cited

U.S. PATENT DOCUMENTS

| | | | | |
|---|---|---|---|---|
| 3,464,013 A * | 8/1969 | Nutt | ........................ | G01R 19/04 324/120 |
| 3,539,932 A * | 11/1970 | Briggs | ................... | G01R 19/04 327/58 |
| 3,599,105 A * | 8/1971 | Weir et al. | ...................... | 327/68 |
| 3,895,237 A * | 7/1975 | Harr | ...................... | H03K 5/1532 327/62 |
| 4,560,940 A * | 12/1985 | van der Schans | ..... | G01R 19/04 327/58 |
| 4,605,867 A * | 8/1986 | Veehof | ..................... | H03D 1/18 327/59 |
| 5,694,038 A * | 12/1997 | Moody | .................... | G01D 3/02 123/146.5 A |
| 2007/0126481 A1* | 6/2007 | Chen | ..................... | G01R 19/04 327/59 |
| 2015/0063434 A1* | 3/2015 | Sonntag | ............. | H04L 27/1563 375/238 |

* cited by examiner

*Primary Examiner* — Paresh Patel
(74) *Attorney, Agent, or Firm* — Trop Pruner & Hu, PC

(57) ABSTRACT

A technique includes using a comparator to indicate whether a magnitude of a monitored signal is within predetermined boundaries and controlling a threshold of the comparator based on a history of the indication.

11 Claims, 5 Drawing Sheets

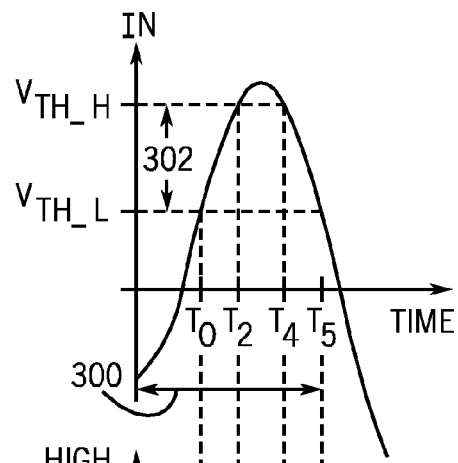
FIG. 3
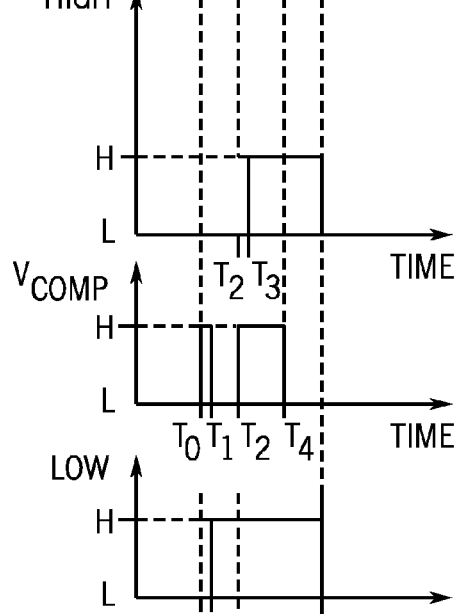
FIG. 4
FIG. 5
FIG. 6
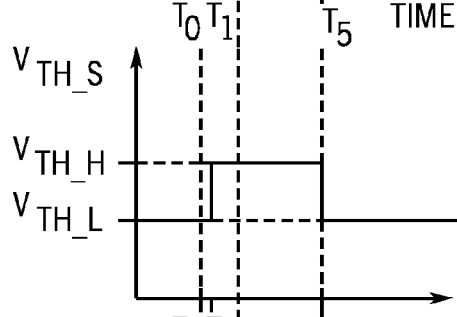
FIG. 7
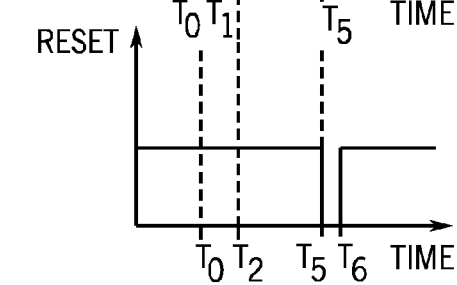
FIG. 8

PEAK DETECTOR

BACKGROUND

A peak detector is an electronic circuit that may be used to provide an indication of the magnitude of a given analog signal. As an example, a peak detector may sample the peak amplitude of a given analog signal, and for this purpose, the peak detector may include a diode that is coupled to a capacitor so that the diode rectifies the signal, and the capacitor stores a voltage that represents the maximum voltage of the signal. Peak detectors may be used in a wide variety of applications, such as applications involving voltage monitoring, power monitoring, amplitude modulation (AM) demodulation, and so forth.

SUMMARY

In an exemplary embodiment, a technique includes using a comparator to indicate whether a magnitude of a monitored signal is within predetermined boundaries and controlling a threshold of the comparator based on a history of the indication.

In another exemplary embodiment, an apparatus includes a comparator, an output circuit and a controller. The comparator compares a first signal to a threshold to generate a second signal, which is indicative of the comparison. The output circuit receives the second signal and generates at least one third signal indicative of whether a magnitude of the first signal is within predetermined boundaries. The controller controls the threshold for the comparator based at least in part on a history of the third signal(s).

In yet another exemplary embodiment, an apparatus includes an integrated circuit that includes a comparator, an output circuit and a controller. The comparator is adapted to compare a first signal to a threshold and generate a second signal, which is indicative of the comparison. The output circuit is adapted to generate at least one third signal, which is indicative of whether a magnitude of the first signal is within predefined boundaries. The controller is adapted to control the threshold based at least in part on a history of the third signal(s).

Advantages and other desired features will become apparent from the following drawing, description and claims.

BRIEF DESCRIPTION OF THE DRAWING

FIGS. 3, 4, 5, 6, 7 and 8 depict signals of a peak detector according to an exemplary embodiment.

DETAILED DESCRIPTION

Some signal processing applications monitor whether the magnitude of a given analog signal is within a predefined window that is defined by upper and lower magnitude boundaries. For example, a wireless receiver may contain a peak detector to indicate whether the magnitude of a signal in its signal processing path is within a certain range so that the receiver may increase or decrease the gain of the signal as appropriate.

Figure 1:
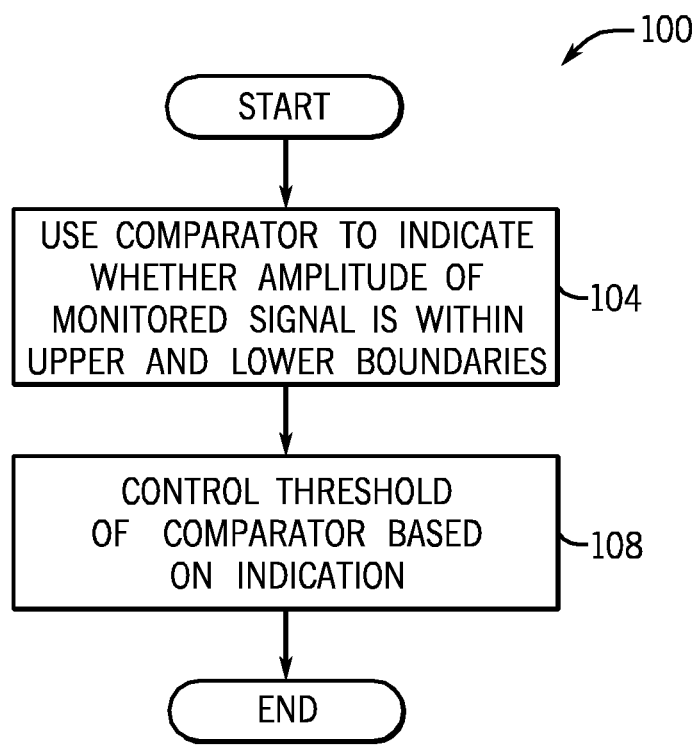
FIGS. 1, 9 and 10 are flow diagrams illustrating techniques to detect whether a signal magnitude is within predetermined boundaries according to exemplary embodiments.

More specifically, for purposes of indicating whether the magnitude of a signal is within a given window, a peak detector may compare the magnitude of the signal to a lower threshold to detect the lower boundary of the window and compare the magnitude of the signal to an upper threshold to detect the upper boundary of the window. In accordance with exemplary embodiments disclosed herein, a peak detector that is efficient with respect to die area and circuit complexity uses a single high gain amplifier, or "comparator," to detect both the upper and lower boundaries of a predefined window to indicate whether a signal magnitude is within the window by controlling a comparison threshold of the comparator in a time multiplexed fashion. More specifically, referring to FIG. 1, in accordance with exemplary embodiments, a technique 100 includes using (block 104) a comparator to indicate whether the magnitude of a monitored signal is within predetermined boundaries. According to the technique 100, a threshold of the comparator is controlled (block 108) based on a history of the indication.

By way of an example, in accordance with an exemplary embodiment, the peak detector first initializes a comparison threshold of a comparator to a lower threshold, which is associated with the lower magnitude boundary of the window. In this manner, the comparator compares the magnitude of the monitored input signal to the lower threshold and generates its output signal accordingly to indicate whether the magnitude of the monitored signal exceeds the lower boundary. In response to the output signal of the comparator indicating that the magnitude of the monitored signal exceeds the lower boundary, the peak detector changes the comparison threshold of the comparator to an upper threshold that is associated with the upper magnitude boundary of the window. Using this new threshold, the comparator compares the magnitude of the monitored input signal to the upper threshold and generates its output signal accordingly to indicate whether the magnitude of the signal exceeds the upper boundary. In accordance with some embodiments, an output circuit of the peak detector latches the comparison results to provide one or more output signals that indicate the monitored signal magnitude relative to the window: whether the magnitude is within the window, below the lower boundary of the window or above the upper boundary of the window.

Figure 2:
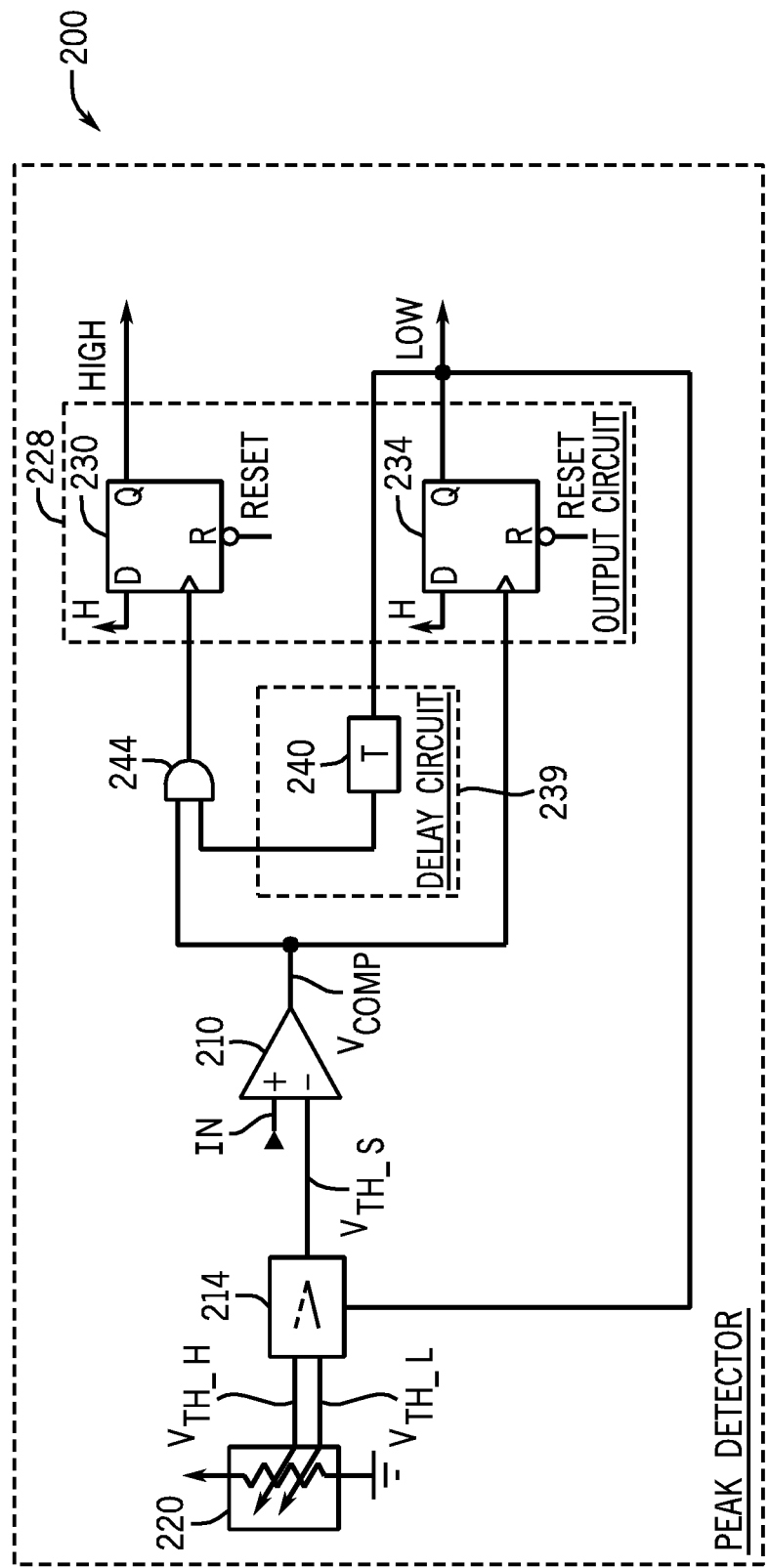
FIG. 2 is a schematic diagram of a peak detector according to an exemplary embodiment.

As a more specific example, FIG. 2 depicts a schematic diagram of a peak detector 200 in accordance with an exemplary embodiment. The peak detector 200 includes a comparator 210, which may be a relatively high gain amplifier, as a non-limiting example. The comparator 210 includes an inverting input terminal that receives a threshold signal (called "$V_{TH\_S}$") and a non-inverting input terminal that receives an input signal (called "IN" herein), which is the signal whose magnitude is being monitored. The comparator 210 compares the IN input signal with the $V_{TH\_S}$ signal and provides an output signal (called "$V_{COMP}$") to indicate the result of the comparison.

More specifically, in accordance with a non-limiting exemplary embodiment, the comparator 210 asserts (drives to a logic one level, for example) the $V_{COMP}$ signal to indicate that the magnitude of the IN signal exceeds the magnitude of the $V_{TH\_S}$ signal; and the comparator 210 de-asserts (drives to a logic zero level for example) the magnitude of the $V_{COMP}$ signal to indicate that the magnitude of the IN signal is below the magnitude of the $V_{TH\_S}$ threshold signal.

The peak detector 200 controls the magnitude of the $V_{TH\_S}$ threshold signal based on the history of output signals that are furnished by the peak detector 200. More specifically, in accordance with an exemplary embodiment, the peak detector 200 provides two output signals called "HIGH" and "LOW," which indicate, respectively, whether the high and low boundaries of a predefined window have been exceeded by the magnitude of the IN input signal during a predefined period of time (called the "detection interval" herein).

In this manner, at the beginning of the detection interval, the peak detector 200 initializes the HIGH and LOW signals to respective initialized states that indicate that neither boundary of the window has been detected. As a non-limiting example, the peak detector 200 may de-assert (drive to logic zero levels, for example) the HIGH and LOW signals to initialize these signals at the beginning of the detection interval, in accordance with an exemplary embodiment.

During the detection interval, the peak detector 200 asserts (drives to a logic one level, for example) the HIGH signal to indicate that the magnitude IN input signal has exceeded the upper boundary of the window and asserts (drives to a logic one level, for example) the LOW signal to indicate that the IN input signal has exceeded the lower boundary of the window. The peak detector 200 controls the magnitude of the $V_{TH\_S}$ signal and thus, the comparison threshold of the comparator 210 based on the history of the HIGH and LOW signals.

More specifically, as a non-limiting example, the peak detector 200 may include an analog switch 214 that contains a switched path that is controlled by the logical state of LOW signal, as depicted in FIG. 2, and is coupled to the inverting input terminal of the comparator 210. As a non-limiting example, the analog switch 214 may contain metal oxide semiconductor field-effect-transistors (MOSFETs) that are selectively activated and de-activated by the state of the LOW signal to selectively couple the inverting input terminal of the comparator 210 to nodes of a biasing network 220, which may be formed from transistors, resistors and so forth. Regardless of its particular form, the biasing network 220 provides bias voltages, called "$V_{TH\_L}$" (a lower voltage) and "$V_{TH\_H}$" (a higher voltage) at respective nodes of the network 220. The analog switch 214 couples one of the nodes of the biasing network to the inverting input of the comparator 210, depending on the state of the LOW signal to establish the level of the $V_{TH\_S}$ signal and thus, establish the threshold for the comparator 210.

In this manner, when the LOW signal is de-asserted (such as at the beginning of the detection interval), the analog switch 214 sets the magnitude of the $V_{TH\_S}$ signal to the lower $V_{TH\_L}$ threshold voltage by coupling the inverting input terminal of the comparator 210 to a particular node of the biasing network 220. With the magnitude of the $V_{TH\_S}$ signal being set to the $V_{TH\_L}$ threshold level, the comparator 210 is configured to detect when the magnitude of the IN input signal exceeds the lower boundary of the window.

In response to the comparator 210 indicating that the magnitude of the IN input signal exceeds the $V_{TH\_S}$ threshold voltage, the peak detector 200 asserts the LOW signal (drives the LOW signal to a logic one level, for example), which causes the analog switch 214 to thereafter couple the inverting input terminal of the comparator 210 to the higher $V_{TH\_H}$ threshold voltage. With the magnitude of the $V_{TH\_S}$ signal being set to the $V_{TH\_H}$ threshold level, the comparator 210 is configured to detect when the magnitude of the IN input signal exceeds the upper boundary of the window. In this manner, when the magnitude of the IN signal exceeds the $V_{TH\_H}$ voltage threshold, the comparator 210 asserts (drives to a logic one level, for example) the $V_{COMP}$ output signal to cause the peak detector 200 to assert the HIGH signal.

As depicted in FIG. 2, in accordance with an exemplary embodiment, the peak detector 200 includes an output circuit 228 that provides the HIGH and LOW signals. More specifically, in accordance with an exemplary embodiment, a non-inverting output terminal of a D-type flip-flop 234 of the output circuit 228 provides the LOW signal. The flip-flop 234 has a clock input terminal that is coupled to the output terminal of the comparator 210. Moreover, the signal input terminal of the flip-flop 234 is coupled to a signal that has a logic one level (or logic high "H" level). At the beginning of the detection interval, the flip-flop 234 is reset (via the de-assertion (driving to a logic zero, for example) of a RESET signal, for example), which causes the flip-flop 234 to de-assert the LOW signal. Therefore, if the threshold of the comparator 210 is set by the lower $V_{TH\_L}$ threshold and the comparator 210 asserts the $V_{COMP}$ signal, the flip-flop 234 correspondingly asserts the LOW signal.

The output circuit 228 further includes a D-type flip-flop 230, whose non-inverting output terminal provides the HIGH signal. The clock input terminal of the flip-flop 230 is coupled to the output terminal of the comparator circuit 210, and the input terminal of the flip-flop 230 receives a signal that has a logic one level (or logic high "H" level). At the beginning of the detection interval, the flip-flop 230 is reset via the RESET signal, which causes the flip-flop 230 to de-assert the HIGH signal. Therefore, if the threshold of the comparator 210 is set by the higher $V_{TH\_H}$ threshold and the comparator 210 asserts the $V_{COMP}$ signal, the flip-flop 230 asserts the HIGH signal.

In accordance with exemplary embodiments, the peak detector 200 includes a delay circuit 239. In general, the delay circuit 239 introduces a predefined damping delay to the response of the peak detector 200 when the LOW signal changes from the de-asserted state to the asserted state for purposes of waiting for a sufficient time to allow the comparator 210 to settle before the comparator 210 is used to detect the upper boundary of the window. The delay circuit 239 includes a delay element 240, which may be a resistor-capacitor (R-C)-based delay element, in accordance with an exemplary embodiment. As depicted in FIG. 2, the delay element 240 is coupled between the output terminal of the flip-flop 234 and the input terminal of an AND gate 244. Another input terminal of the AND gate 244, in turn, is coupled to the output terminal of the comparator circuit 210. The output terminal of the AND gate 210 is coupled to the clock input terminal of the flip-flop 228. Due to this arrangement, upon the LOW signal transitioning from a de-asserted state to an asserted state, the delay circuit 239 prevents the flip-flop 230 from responding to the comparator 210 for a momentary delay interval, thereby ensuring that any glitch in the $V_{COMP}$ signal does not incorrectly cause assertion of the HIGH signal.

FIGS. 3-8 depict operation of the peak detector 200 for indicating the magnitude of an exemplary IN input signal relative to a magnitude window 302 during an exemplary detection interval 300. Referring to FIGS. 3-8 in conjunction with FIG. 2, for this example, it is assumed that the output circuit 228 of the peak detector 200 is initialized at the beginning of the detection interval 300 so that the HIGH and LOW output signals are in their initial, de-asserted states, as depicted in FIGS. 4 and 6. Moreover, at the beginning of the detection interval 300, the comparator 210 is configured to compare the IN input signal to the lower threshold voltage $V_{TH\_L}$, as shown by the $V_{TH\_S}$ signal having the $V_{TH\_L}$ voltage level in FIG. 7.

At time $T_0$, the IN input signal enters the window 302 i.e., has a magnitude between the $V_{TH\_L}$ and $V_{TH\_H}$ voltages. Thus, at time $T_0$ the comparator 210 asserts the $V_{COMP}$ signal (see FIG. 5), which also causes the LOW signal to be de-asserted thereafter a short time later at time $T_1$, as depicted in FIG. 6. The LOW signal remains asserted until time $T_5$ when the RESET signal is momentarily de-asserted to reset the flip-flops 230 and 234 to end the current detection interval 300 and being another detection interval, as depicted in FIG. 8. At time $T_1$ the $V_{TH\_S}$ threshold signal changes to the $V_{TH\_H}$ voltage, as depicted in FIG. 7. It is noted that after time $T_0$, the delay circuit 239 prevents the flip-flop 230 from "seeing" the state of the comparator 210 for the period of the delay to allow the comparator 210 to settle.

As depicted in FIG. 3, at time $T_2$, the IN input signal reaches the $V_{TH\_H}$ upper threshold voltage, which causes the comparator 210 to assert the $V_{COMP}$ signal, which, in turn, causes the flip-flop 230 to assert the HIGH signal a short time later at time $T_3$. As depicted in FIGS. 4 and 6, the HIGH and LOW signals remain asserted until time $T_5$ (when the RESET signal is de-asserted to end the detection interval 300). It is noted that the $V_{COMP}$ signal is de-asserted at time $T_4$ due to the IN signal decreasing below the $V_{TH\_H}$ voltage, as shown in FIG. 3.

Figure 9:
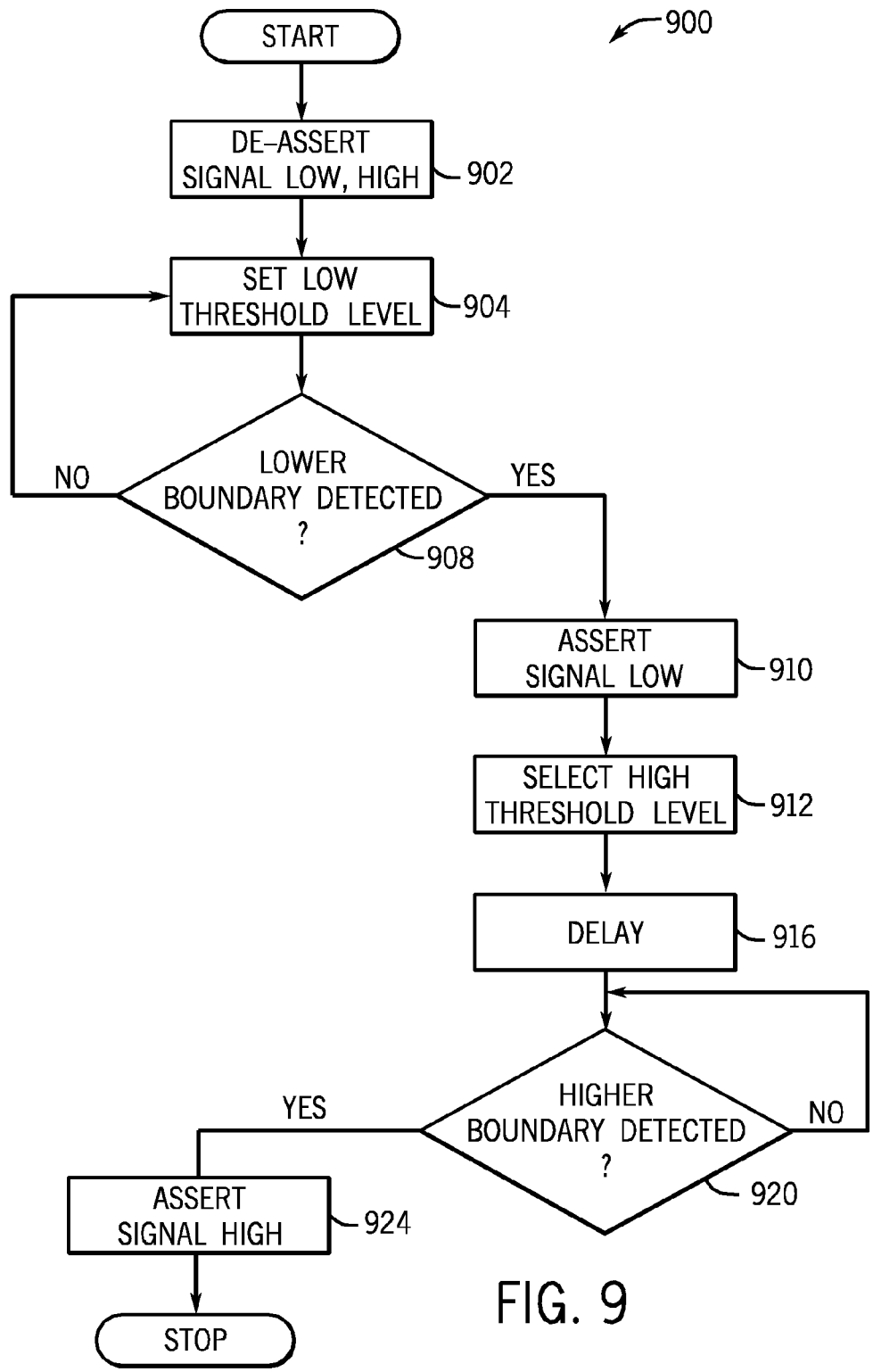
Figure 10:
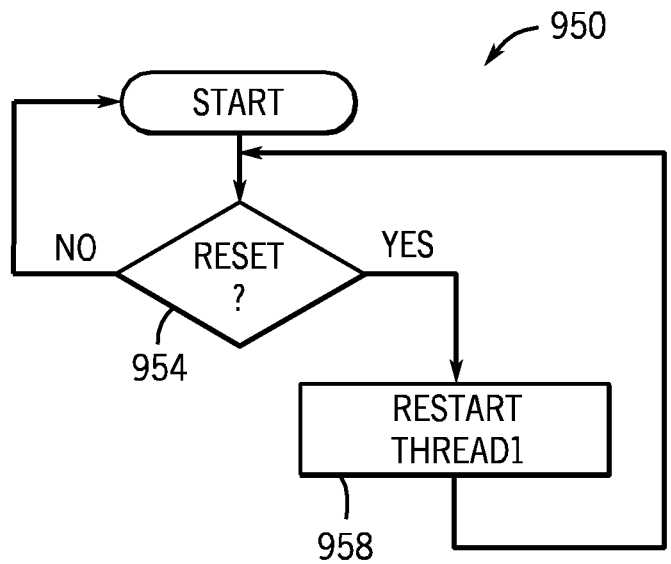

In accordance with exemplary embodiments, a multi-threaded technique that is illustrated in FIGS. 9 and 10 may be used for purposes of controlling the threshold of a comparator of a peak detector. The technique is depicted in connected with a first thread (shown by a flowchart 900 in FIG. 9) that controls the assertion/de-assertion of the HIGH and LOW signals during a given detection interval; and a second thread (shown by a flowchart 950 in FIG. 10) that controls when the first thread is re-started (to begin another detection interval). The first and second threads may be asynchronous with respect to each other, in accordance with some embodiments.

Referring to FIG. 9, the first thread de-asserts (block 902) the LOW and HIGH signals (the signals are driven to logic zero levels, for example) and selects (block 904) a low threshold level for the comparator. A determination is then made (decision block 908) whether the lower boundary of the window has been detected. After the lower boundary is detected, the first thread asserts (block 910) the LOW signal (drives the LOW signal to a logic one level, for example); selects (block 912) a higher threshold level for the comparator; and introduces (block 916) a delay. When the higher boundary of the window has been detected (as depicted by decision block 920), the first thread asserts the HIGH signal, pursuant to block 924.

Referring to FIG. 10, the second thread determines (as depicted by decision block 954) when the first thread is to be restarted and restarts the first thread accordingly, pursuant to block 958. As a non-limiting example, the second thread may be an interrupt routine that is executed by a processor (a microprocessor, for example) in response to periodic interrupts that are generated by a timer, in accordance with some embodiments.

Figure 11:
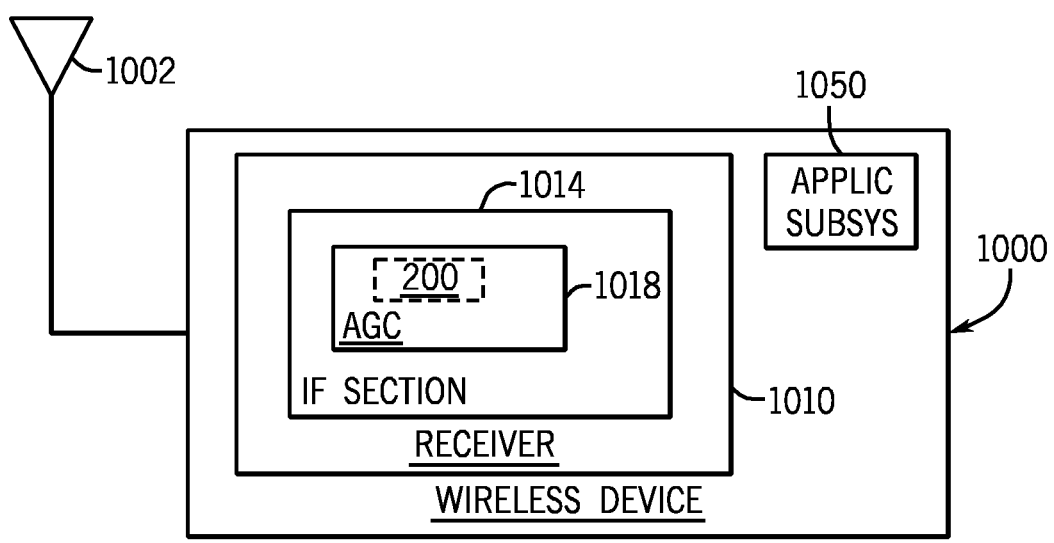
FIG. 11 is a schematic diagram of a wireless device according to an exemplary embodiment.

Referring to FIG. 11, in accordance with an exemplary embodiment, the peak detector 200 may be used by a wireless device 1000. The wireless device 10 may be used in a number of different applications for purposes of communicating data over a wireless link. As non-limiting examples, the wireless device 1000 may be a personal computer (PC) peripheral; a wireless toy; a remote keyless entry; an industrial control; a home automation controller, sensor or slave device; a sensor network; etc. In general, the wireless device 1000 may include an application subsystem 1050, which tailors the wireless device 1000 for a specific application, and may, for example, form a user interface for the device 1000. In general, the application subsystem 1050 may perform various application processing tasks relating to the application in which the wireless device 1000 is employed. These tasks may involve receiving data from a receiver 1010, which receives and demodulates a radio frequency (RF) signal that is received on an antenna 1002 of the wireless device 1000.

For this example, the receiver 1010 includes an intermediate frequency (IF) section 1014 that includes an automatic gain control circuit (AGC) 1018 that monitors the strength of an IF signal using the peak detector 200 and controls the gain of at least one amplifier in a signal path of the IF section 1014 to control a gain that is applied to this signal. In this manner, the IF signal that is processed by the IF section 1014 may vary due to the strength of the RF signal that is received by the receiver 1010; and the AGC 1018 adjusts an internal gain of the IF section's signal path to accommodate the range of signal strengths. Thus, based on the signals that are provided by the peak detector 200, the analog AGC circuit 1018 causes the receiver 1010 to generally apply more gain to weaker signals and less gain to stronger signals. If insufficient gain is applied by AGC 1018, then the receiver 1010 may suffer from poor signal-to-noise (S/N) performance. If, however, the AGC 1018 applies too much gain to the received RF signal, then the circuitry of the receiver may become saturated and introduce significant non-linearities to the processed signal.

In accordance with some exemplary embodiments, the receiver 1010 includes various components, which may be part of the same integrated circuit (may be fabricated in the same or on separate dies of the same semiconductor package, for example). In some exemplary embodiments, the entire receiver 1010 may be fabricated on a single die and as such, may be part of a single integrated circuit, multi chip module (MCM), etc.

Note that, rather than a heterodyne receiver, other types of receiver may be used, as persons of ordinary skill in the art understand. For example, in some embodiments, direct conversion receivers may be used, as desired. Furthermore, in some embodiments, the receiver circuitry may be combined with, or used in conjunction with, a transmitter, to form a transceiver or a device for two-way communication, as desired.

Although the description of some exemplary embodiments above refers to "logic high," "logic low," etc., other Boolean logic arrangements may be used, as persons of ordinary skill in the art understand. For example, inverted logic, active-low logic, etc., may be used in some embodiments, as desired.

While a limited number of embodiments have been disclosed herein, those skilled in the art, having the benefit of this disclosure, will appreciate numerous modifications and variations therefrom. It is intended that the appended claims cover all such modifications and variations.

What is claimed is:

1. An apparatus comprising:
  a comparator to compare a first signal to a threshold to generate a second signal indicative of the comparison;

an output circuit to receive the second signal and generate at least one third signal indicative of whether a magnitude of the first signal is within predetermined boundaries; and a controller to control the threshold for the comparator based at least in part on whether the at least one third signal indicates that the first signal is within a region defined by the predetermined boundaries.

2. The apparatus of claim 1, wherein the predetermined boundaries comprise a lower boundary, and the controller is adapted to change the threshold based at least in part on whether the at least one third signal indicates that the magnitude of the first signal has exceeded the lower boundary.

3. The apparatus of claim 1, wherein the predefined boundaries comprise lower and boundaries, and the controller is adapted to selectively change the threshold between upper and lower values based on the at least one third signal.

4. The apparatus of claim 1, wherein the output circuit comprises at least one latch to provide the at least one third signal.

5. The apparatus of claim 4, wherein the at least one latch comprises a first latch to provide a signal indicative of whether the magnitude of the first signal has exceeded one of the predetermined boundaries and a second latch to indicate whether the magnitude of the first signal has exceeded another one of the predefined boundaries.

6. The apparatus of claim 1, wherein the controller comprises a switch coupled to an input terminal of the comparator and adapted to selectively couple the input terminal to one of multiple threshold values.

7. The apparatus of claim 1, further comprising:

a delay circuit adapted to introduce a predetermined delay interval to delay the output circuit from updating the at least one third signal until after a predefined delay occurs after a comparison indicated by the comparator changes.

8. An apparatus comprising:

an integrated circuit comprising a comparator, an output circuit and a controller, wherein the comparator is adapted to compare a first signal to a threshold and generate a second signal indicative of the comparison, the output circuit is adapted to generate at least one third signal indicative of whether a magnitude of the first signal is within predefined boundaries, and the controller is adapted to control the threshold based at least in part on whether the at least one third signal indicates that the first signal is within a region defined by the predefined boundaries.

9. The apparatus of claim 8, further comprising a gain control circuit to regulate a gain of the first signal based at least in part on the at least one third signal.

10. The apparatus of claim 9 , wherein the first signal comprises an intermediate signal produced by a receiver.

11. The apparatus of claim 10, wherein the predefined boundaries comprise a lower boundary, and the controller is adapted to change the threshold based at least in part on whether the at least one signal indicates that the magnitude of the first signal has exceeded the lower boundary.

\* \* \* \* \*